(12) United States Patent
Russell

(10) Patent No.: US 9,766,269 B2
(45) Date of Patent: Sep. 19, 2017

(54) CONDUCTIVE TEST PROBE

(71) Applicant: Power Probe, Inc., Brea, CA (US)

(72) Inventor: Wayne Russell, Ontario, CA (US)

(73) Assignee: Power Probe TEK, LLC, Brea, CA (US)

( * ) Notice: Subject to any disclaimer, the term of this patent is extended or adjusted under 35 U.S.C. 154(b) by 462 days.

(21) Appl. No.: 13/730,850

(22) Filed: Dec. 29, 2012

(65) Prior Publication Data

US 2014/0184260 A1    Jul. 3, 2014

(51) Int. Cl.
| | | |
|---|---|---|
| G01R 1/067 | (2006.01) |
| G01R 1/00 | (2006.01) |
| H01L 21/00 | (2006.01) |
| G01R 3/00 | (2006.01) |

(52) U.S. Cl.
CPC ............ G01R 1/06788 (2013.01); *G01R 1/00* (2013.01); *G01R 1/06755* (2013.01); *G01R 3/00* (2013.01); *H01L 21/00* (2013.01); *H01L 2221/00* (2013.01)

(58) Field of Classification Search
CPC . H01L 21/00; H01L 2221/00; H01L 2223/00; H01L 2924/00; H01L 2925/00; G01R 1/00
USPC ..................................................... 324/755.01
See application file for complete search history.

(56) References Cited

U.S. PATENT DOCUMENTS

| | | | | |
|---|---|---|---|---|
| 4,783,624 A * | 11/1988 | Sabin | ........................ | 324/754.03 |
| 5,363,048 A * | 11/1994 | Modlin | .............. | G01R 31/2805 |
| | | | | 324/519 |
| 5,367,250 A | 11/1994 | Whisenand | | |
| 5,448,173 A * | 9/1995 | Shinohara | ............ | H05H 1/0081 |
| | | | | 324/444 |
| 5,877,618 A * | 3/1999 | Luebke | ..................... | G01R 1/07 |
| | | | | 324/133 |
| 6,246,247 B1 * | 6/2001 | Eldridge | .............. | B23K 20/004 |
| | | | | 257/E21.503 |
| 6,551,844 B1 * | 4/2003 | Eldridge | ............ | G01R 1/07307 |
| | | | | 257/E23.021 |
| 7,184,899 B2 | 2/2007 | Cruz | | |
| 7,768,292 B1 * | 8/2010 | Koch | ..................... | G01R 31/40 |
| | | | | 324/764.01 |
| 8,315,819 B1 * | 11/2012 | Williams | ................ | H01L 22/14 |
| | | | | 257/48 |
| 2003/0071331 A1 * | 4/2003 | Yamaguchi | ............. | H01L 24/11 |
| | | | | 257/669 |
| 2003/0113944 A1 * | 6/2003 | Kanamaru | ............ | H01L 23/544 |
| | | | | 438/14 |
| 2004/0096995 A1 * | 5/2004 | Low | ........................ | H01L 22/34 |
| | | | | 438/18 |

(Continued)

OTHER PUBLICATIONS

U.S. Appl. No. 13/404,644 entitled Electrical Test Device and Method and filed Feb. 24, 2012.

(Continued)

*Primary Examiner* — Jermele M Hollington
*Assistant Examiner* — Temilade Rhodes-Vivour
(74) *Attorney, Agent, or Firm* — Rutan & Tucker LLP; Hani Z. Sayed

(57) ABSTRACT

A conductive probe may include a probe body for communicating with a circuit tester or a jumper. The probe body may be formed of metal and may have a free end. A probe tip may be mounted to the end of the probe body. The probe tip may be formed of thorium-tungsten. The probe tip may be configured for contacting a circuit node.

20 Claims, 4 Drawing Sheets

(56) References Cited

U.S. PATENT DOCUMENTS

| | | | | |
|---|---|---|---|---|
| 2005/0230358 A1* | 10/2005 | Chaskin | ................... | 219/85.15 |
| 2006/0108678 A1* | 5/2006 | Kumar | .............. | B23K 35/0222 |
| | | | | 257/690 |
| 2009/0072845 A1* | 3/2009 | McCoy et al. | ............... | 324/754 |
| 2010/0201388 A1* | 8/2010 | Forbes | .............. | G01R 1/06788 |
| | | | | 324/755.02 |

OTHER PUBLICATIONS

TE Connectivity, "Relay Book—Contact System", available at <http://relays.te.com/schrack/pdf/C0_v4bg_4.pdf>, last visited Dec. 27, 2012.

* cited by examiner

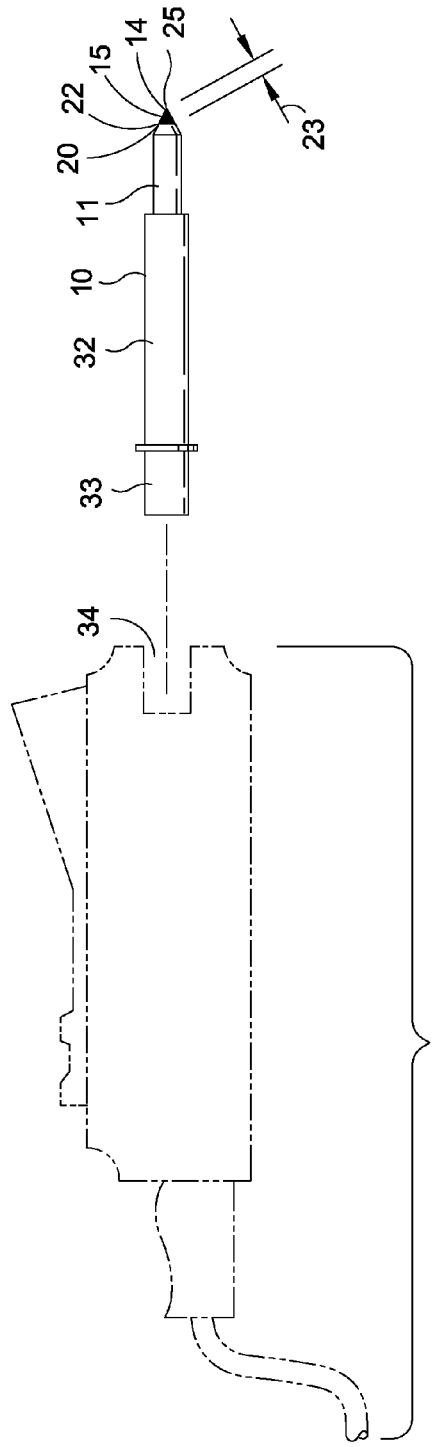
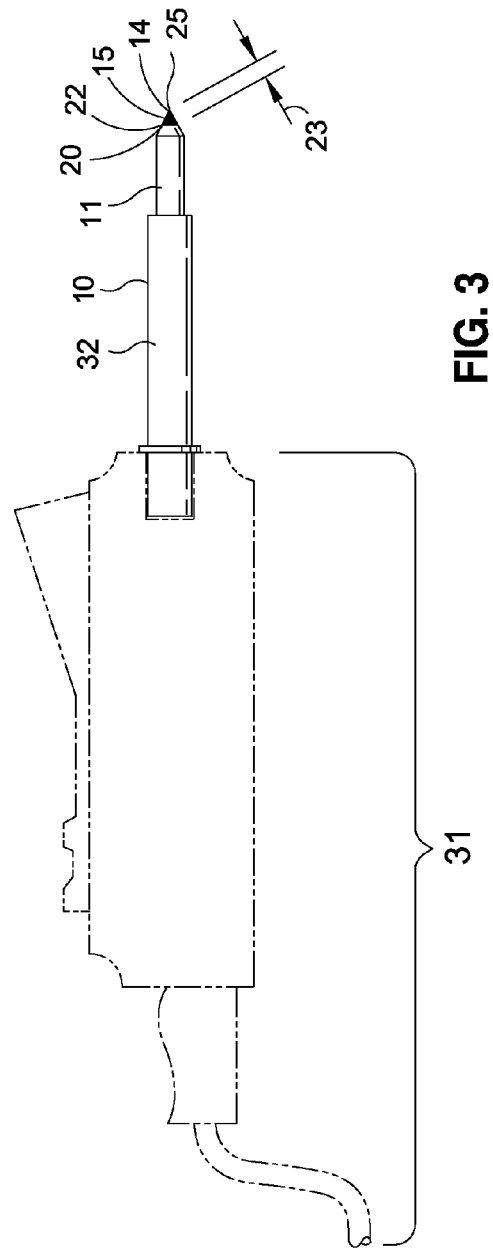
FIG. 2
FIG. 3

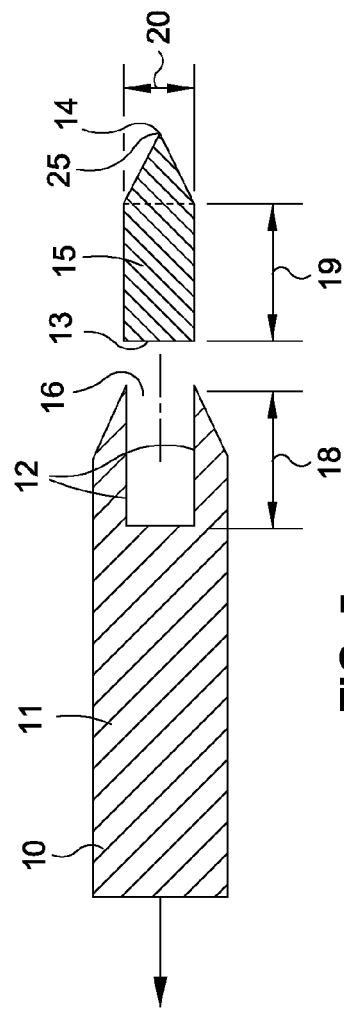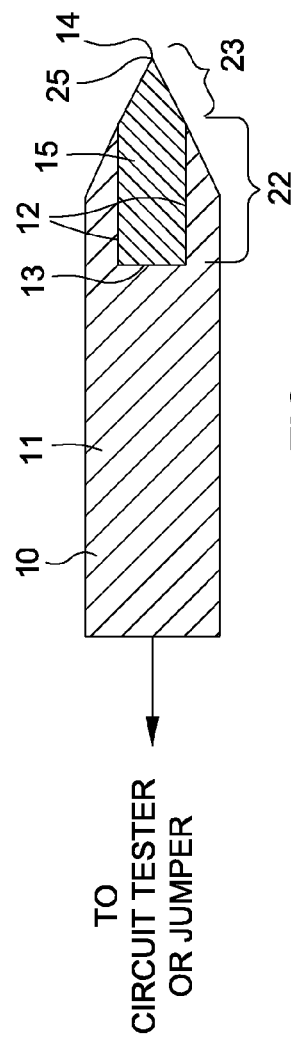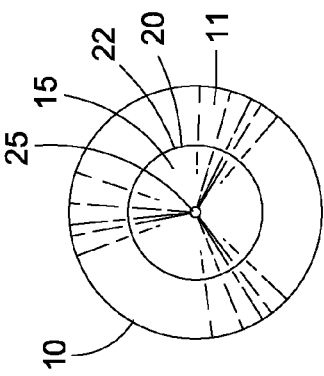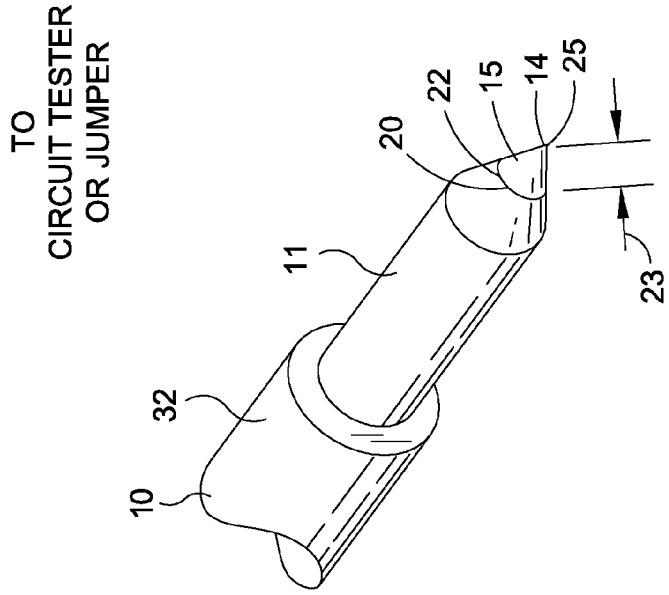

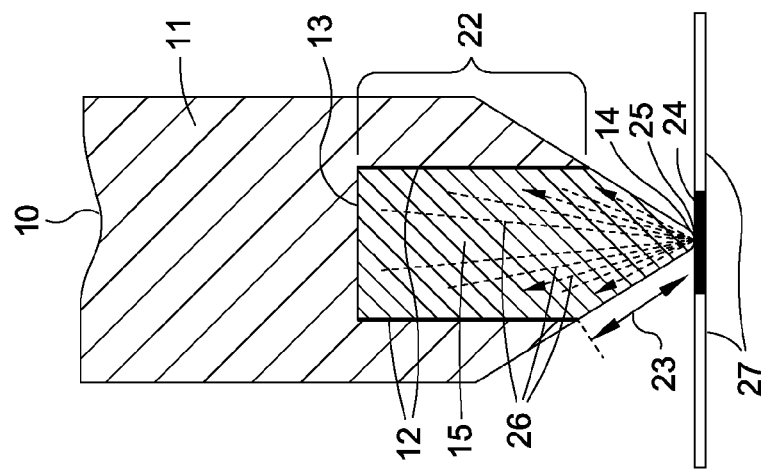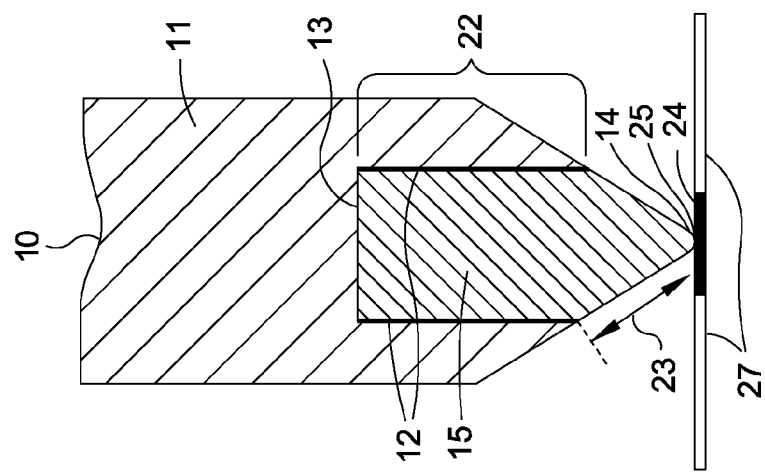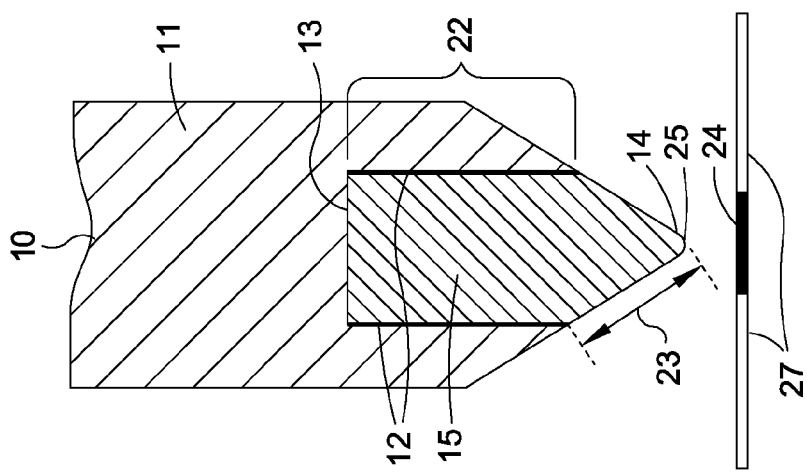

CONDUCTIVE TEST PROBE

CROSS-REFERENCE TO RELATED APPLICATIONS

The present application is related to U.S. patent application Ser. No. 13/404,644 entitled ELECTRICAL TEST DEVICE AND METHOD and filed on Feb. 24, 2012, and to U.S. Pat. No. 7,184,899, issued on Feb. 27, 2007, and which is entitled ENERGIZABLE ELECTRICAL TEST DEVICE FOR MEASURING CURRENT AND RESISTANCE OF AN ELECTRICAL CIRCUIT, the entire contents of application Ser. No. 13/404,644 and U.S. Pat. No. 7,184,899 being expressly incorporated by reference herein.

FIELD

The present disclosure relates generally to electrical test equipment and, more particularly, to a conductive probe for a circuit tester or a jumper.

BACKGROUND

The incidence and complexity of electronic circuitry continues to increase, requiring improvements in the efficiency and functionality of the test equipment necessary to diagnose and repair such circuitry. Test equipment such as multi-meters and logic analyzers may generally communicate with the circuitry being tested via one or more conductive test probes. Test probes may be configured to pierce an insulated wire or contact an exposed electrical terminal. Measured parameters may include resistance, voltage, current, impedance, frequency, and digital waveforms. In addition, some multi-meters, such as the multi-meter disclosed in U.S. Pat. No. 7,184,899, have a "power and measure" feature, allowing a technician to probe a circuit, initiate current sourcing, and simultaneously measure electrical parameters, thus enhancing test efficiency. Some important quality goals for test equipment may include collecting accurate measurements at the required resolution without interfering with the operating point of the circuit under test. Unfortunately, certain design aspects of conventional test equipment may result in poor measurement quality when diagnosing a circuit.

For example, one cause of poor measurement quality may be a test probe resistance that is higher than the required measurement resolution. For example, a test probe resistance of 100 milliohms (m$\Omega$) would interfere with the accurate measurement of a circuit resistance requiring a resolution of 10 m$\Omega$ by adding 100 m$\Omega$ to the measurement result. Test probe resistance is measured across the conducting length of the test probe, and does not include the contact resistance occurring between the test probe and the circuit node. Test probe resistance may depend on the resistivity of the conductor used, on corrosion, and on any damage that occurs due to misuse or high current flow. Often, the test probe may be fabricated from a metal material having a relatively low resistivity, which may be adequate for conducting moderate current flows of less than approximately 1 to 10 amps. For example, brass, an alloy of copper and zinc, has a resistivity of approximately 6-7 $\mu\Omega$-cm, where metals in general may range from 1-300 $\mu\Omega$-cm in resistivity. However, many automotive circuits require testing with high current flows of from approximately 10 to 100 amps or more, which may require the alteration of the geometry or diameter of a brass or steel test probe to insure that test probe resistance remains small.

Another cause of poor measurement quality may be electrical arcing that may occur between the test probe and the circuit node being measured. Arcing may generally begin during the making or breaking of contact involving a live circuit in close proximity. A live circuit may occur by either placing a test probe onto an energized circuit node having a voltage, or by placing an energized test probe onto a non-energized or passive circuit node, or both. A sustained arc having sufficient heat energy, i.e., sufficient current, may melt steel. The effect of even momentary arcing may be a break down or damage in the conductor material such as brass or steel, causing heating, burning, melting, material migration, molecular voids, and a permanent rise in test probe resistance that begins to interfere with the quality of the measurement. Arcing may self-extinguish once the distance between electrical nodes increases. However, the availability of larger current flows may increase the heat energy within an arc, increasing the possibility of material damage. A test probe susceptible to arc damage may degrade progressively over time, attracting larger and longer arcs, and increasing test probe resistance further. Conventional metallic test probes may therefore require frequent replacement.

Another cause of excessive test probe resistance may be a temporary heating of the sharpened tip through either arc heating or resistive heating. During arc heating, initiating an electrical contact may give rise to a momentary arc over the sharpened tip of the test probe, heating the surface of the probe tip. Since many metals, such as brass and steel, possess positive resistive temperature coefficients, their resistivity may increase upon the occurrence of an arc. A multi-meter measurement immediately following such an arc may experience increased test probe resistance that gives rise to measurement error. In addition to arc heating, a substantial current flow through the sharpened tip during a measurement may give rise to resistive heating that also creates increased resistivity, building on any preceding arc heating and causing more measurement error. For example, a sharpened tip comprised of a metal having a positive temperature coefficient may be required to conduct the flow of 100 amps through a very small volume of metal, generating heat and increased resistance, and subsequently measurement error. For example, a 100° C. increase in the temperature of the tip of a copper test probe having a temperature coefficient of 0.0043/° C. causes tip resistance to increase by 43% (i.e., 100×0.0043), and causing an increase in overall test probe resistance.

Another problem that may arise during measurements involving a conductive test probe relates to the arc detection circuitry disclosed in the above-mentioned application Ser. No. 13/404,644. During arc detection, high frequency spectra may be analyzed for evidence of arcing internal to the circuitry being powered and measured by the test equipment. The test may be terminated by a circuit breaker upon detection of an internal arc. The accuracy of the measurement depends on a fast rise time in the voltage or current, which requires a small test probe resistance. However, the occurrence of test probe arcing may interfere with the internal detection of arcing by interfering with the sense threshold causing arcing to increase before the sense threshold is achieved. Additionally, as the test probe resistance increases further and the rise time gets progressive slower, the response may eventually become so delayed that the circuit breaker does not shut down at all, posing a fire hazard to a circuit that is external arcing.

A further cause of excessive test probe resistance may be the use of test probe geometries that generate high resistive losses. For example, the sharpened tip of the test probe may be the location of highest current density and may thereby contribute excessively to the overall test probe resistance if there is a long path from the probe tip to a conductive portion of the test probe having relatively low current density. In addition, local heating may occur near the tip due to current flow, further increasing path resistance.

As can be seen, there exists a need in the art for a durable conductive test probe that can withstand arcing over many cycles under high current conditions. Additionally, there exists a need in the art for a test probe that maintains a low resistance at high currents during arcing so that measurement resolution and accuracy are maintained. Furthermore, there exists a need in the art for a test probe that preserves the rise time of arc detection circuitry by preventing an increase in test probe resistance caused by arcing. There also exists a need in the art for a test probe that can withstand many contact cycles under live circuit conditions. In addition, there exists a need in the art for a conductive test probe that has a compact (i.e., small) geometry that minimizes test probe resistance.

BRIEF SUMMARY

The above-noted needs associated with conductive probes are specifically addressed and alleviated by the present disclosure which, in an embodiment, provides a conductive probe having a probe body for communicating with a circuit tester or a jumper. The probe body may be comprised of metal and has a free end. A probe tip comprised of thorium-tungsten may be mounted to the free end of the probe body. The probe tip may be configured for contacting a circuit node.

Also disclosed is a conductive probe that may comprise a probe body for communicating with a circuit tester or a jumper. The probe body may be comprised of metal and may have a socket formed in a free end. A probe tip may be comprised of thorium-tungsten and may have a buried end mounted within the socket of the probe body. The socket may be shaped and sized complementary to the buried end in order to minimize the contact resistance between the probe body and the probe tip. The probe tip may have a narrowed end located opposite the buried end. The narrowed end may be narrowed to a contact surface for contacting a circuit node. The shortest distance between the contact surface and the probe body may be less than approximately 0.250 inch.

Also disclosed is a durable tip that may comprise a probe tip receivable by a probe body configured for communicating with a circuit tester or a jumper. The probe tip may be comprised of thorium-tungsten and may have a buried end that may be receivable by the probe body in such a manner that contact resistance between the probe tip and the probe body is minimized. The probe tip may have a narrowed end located opposite the buried end. The narrowed end may be narrowed to a contact surface for contacting a circuit node. The shortest distance between the contact surface and the probe body may be less than approximately 0.250 inch.

The features, functions and advantages that have been discussed can be achieved independently in various embodiments of the present disclosure or may be combined in yet other embodiments, further details of which can be seen with reference to the following description and drawings below.

BRIEF DESCRIPTION OF THE DRAWINGS

These and other features of the present disclosure will become more apparent upon reference to the drawings wherein like numbers refer to like parts throughout and wherein:

FIG. 2 is an exploded side view of an embodiment of a conductive probe having a probe plug for mating with a circuit tester having a probe jack.

FIG. 3 is a side view of an embodiment of the conductive probe of FIG. 2 mated to the circuit tester.

FIG. 4 is a perspective view of an embodiment of a conductive probe.

FIG. 5 is an exploded sectional view of an embodiment of a conductive probe comprising a probe body and a probe tip.

FIG. 6 is a sectional view of the conductive probe of FIG. 5 showing the probe tip mated to the probe body.

FIG. 7 is an end view of the embodiment of the conductive probe of FIG. 6.

FIG. 8A is a side sectional view of an embodiment of a conductive probe in a ready position above a circuit node to be measured.

FIG. 8B is a side sectional view of the conductive probe in contact with the circuit node to be measured.

FIG. 8C is a side sectional view of the conductive probe in energized contact with a circuit node and illustrating the density of current flow through the probe tip.

DETAILED DESCRIPTION

Figure 1:
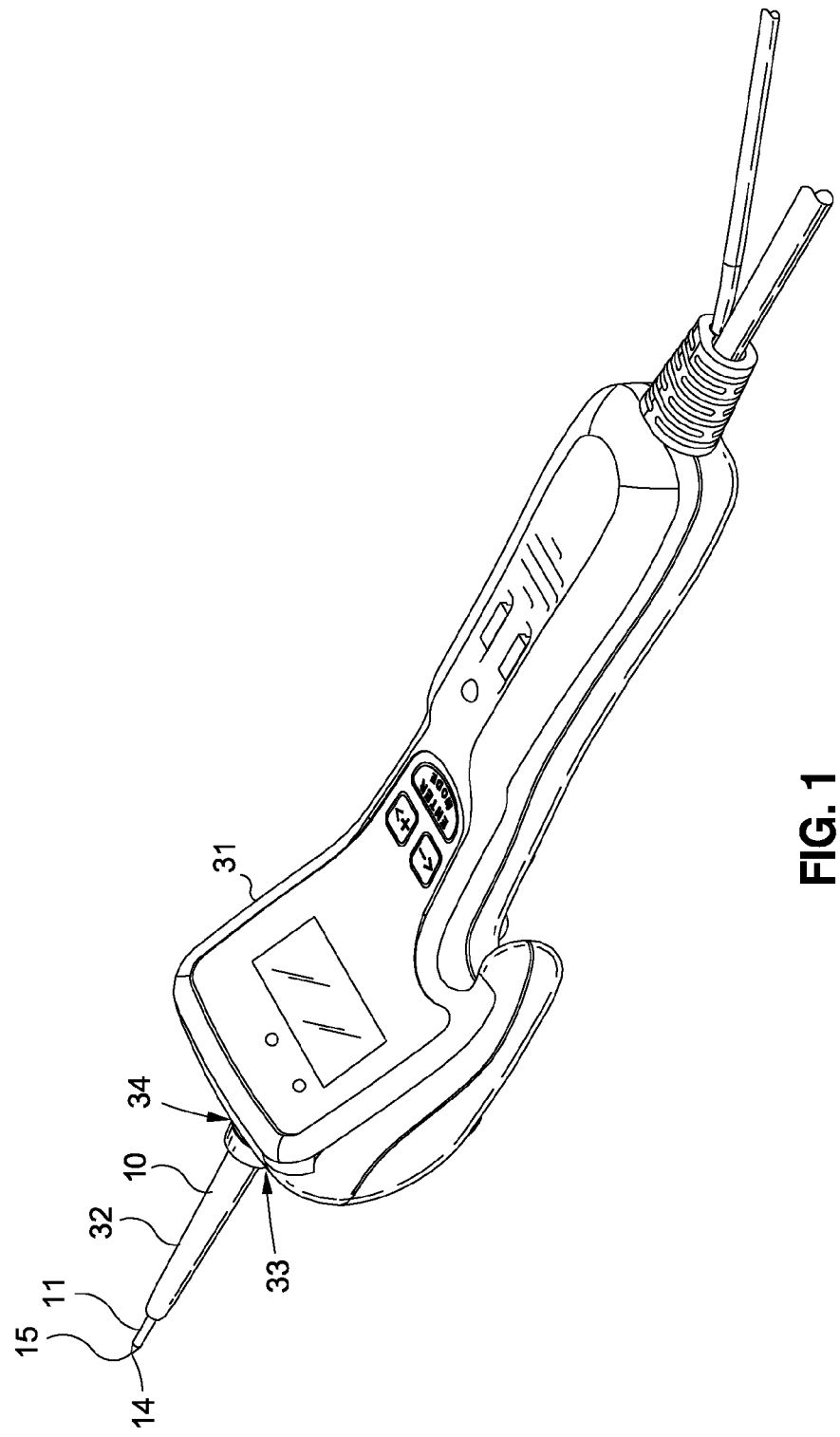
FIG. 1 is a perspective view of an embodiment of a circuit tester having a conductive probe attached thereto.

Referring now to the drawings wherein the showings are for purposes of illustrating various aspects of the present disclosure, shown in FIG. 1 is an embodiment of a circuit tester 31 coupled to a conductive probe 10 for the purpose of making electrical contact with a circuit to be measured. Circuit tester 31 may comprise a multi-meter electrical circuit tester or other electrical test equipment or test device such as may be used to diagnose or repair an electrical circuit. Probe body 11 may conduct an electrical signal (not shown) between circuit tester 31 and probe tip 15. The narrowed end 14 of probe tip 15 may be narrowed in at least one dimension relative to a contact surface 25 so that the probe tip 15 is capable of piercing the electrical insulation of a wire or to facilitate reliable contact of the probe tip 15 with a circuit node (not shown) such as an exposed electrical terminal. Although the probe tip 15 is shown having a conical narrowed end 14 (e.g., narrowed in two dimensions), the probe tip 15 may be provided with alternative geometries, such as a blade configuration (not shown) or a multiple prong configuration (not shown). In this regard, the probe tip 15 may be configured to achieve a low contact resistance with a circuit node while minimizing the electrical resistance of the conductive probe 10.

In an embodiment, the circuit tester 31 (e.g., FIG. 1) may be configured to supply current to conductive probe 10 while retrieving and displaying measured electrical parameters such as voltage, current, resistance, frequency, or digital information. For example, a technician operating the circuit tester 31 may press an actuating button (not shown) to begin current sourcing to provide current to a circuit under test, preferably after contacting the probe tip 15 with the circuit node (not shown) under test. However, in embodiments, a technician may prematurely actuate current sourcing from circuit tester 31, making contact with what may be called a live (i.e., energized) circuit, and which may result in adverse consequences, as will be discussed below.

Referring still to FIG. 1, in an embodiment, the probe body 11 may be fabricated of brass, steel or other suitable metallic material or conductor and which may have a relatively low resistivity. Circuit tester 31 and conductive probe 10 may be configured to receive or supply relatively high current flows such as, for example, currents of approximately 10 to 100 amps or more, and which may be particularly relevant in the field of automotive electronics. At such relatively high current flows, it is preferable that the conductive probe 10 provides a very low resistance path in order to avoid excessive ohmic losses which may result in measurement errors such as measurement errors by the circuit tester 31.

At automotive voltages of approximately 12 volts and higher, electrical arcing may occur between the narrowed end 14 and a circuit node (not shown) being contacted, such as when making or breaking contact in the presence of voltage (live contact). The effect of arcing at narrowed end 14, especially when relatively high current flows are available, may be a breakdown, melting, or other damage to the material of the conductive probe 10. Such material breakdown may result in permanent and progressively higher resistance to test currents flowing through conductive probe 10, and consequently may cause stronger arcs and multimeter (e.g., circuit tester 31) measurement errors. Since narrowed end 14 may have a substantially smaller width than probe body 11, probe tip 15 may dominate the overall resistance of conductive probe 10. Therefore, resistance increases in probe tip 15 caused by arcing damage may substantially increase the resistance of conductive probe 10. For example, brass, steel, and other conductors having relatively low to moderate melting temperatures may be particularly susceptible to tip damage during arcing. In this regard, while brass, steel, and other conductors or materials may meet the resistivity requirements of high current flows, such materials may not provide for a durable probe tip 15, and may cause measurement errors.

Referring now to FIG. 2, shown is an embodiment of a conductive probe 10 configured with a probe plug 33 for electrically mating with circuit tester jack 34 of circuit tester 31. The mating of the outer surface of probe plug 33 to the inner surface of circuit tester jack 34 may provide a low contact resistance to prevent measurement error, yet may allow for easy replacement of conductive probe 10. While a plug and jack arrangement is shown in this embodiment for attaching the conductive probe 10 to the circuit tester 31, it is to be understood that other forms of temporary or permanent attachment are possible. For example, the conductive probe 10 may be attached to a circuit tester by means of a threaded attachment or by means of sliding fit. In a further embodiment not shown, the probe and jack assignments may be reversed, with the conductive probe 10 being outfitted with a jack instead of a probe plug 33, and the circuit tester 31 being outfitted with a plug instead of a circuit tester jack 34.

Referring still to FIG. 2, an embodiment of a conductive probe 10 comprises probe body 11 which may conduct electrical current between probe plug 33 and probe tip 15 mounted to the end of probe body 11. In an embodiment, buried end width 20 (FIG. 5) may define the diameter of a buried end (not shown) of probe tip 15 that may be sized and configured for an interference fit within the probe body 11. In an embodiment, narrowed end 14 may be conical in shape for contacting a circuit node (not shown) to be measured. Probe tip 15 may be comprised of thorium-tungsten having an immunity to material breakdown in the presence of electrical arcing, and which may have a relatively high melting temperature. For example, thorium-tungsten may have a melting temperature of approximately 3410° C. Probe body 11 may be comprised of a low-cost conductor material having relatively low resistivity. In an embodiment, the probe body 11 may be formed of any one of a variety of different metallic materials, without limitation, including brass, copper, steel, or other metallic materials or alloys thereof.

Probe tip 15 may be sized and configured to provide a relatively short distance, i.e., a shortest distance 23 (FIG. 6), between contact surface 25 and a free end of the probe body 11. For example, the probe tip 15 may provide a shortest distance 23 in an embodiment wherein the probe tip 15 is press fit into the probe body 11. Because thorium-tungsten may have substantially higher electrical resistance than the material of the probe body 11, the shortest distance 23 may advantageously limit the overall path resistance through conductive probe 10 to be less than the measurement resolution required by circuit tester 31, thereby preventing measurement errors. Furthermore, the connection of the thorium-tungsten probe tip 15 to the low-resistivity probe body 11 along the shortest distance 23 advantageously provides for a durable conductive probe 10 capable of conducting high current flows and withstanding arcing without degradation or damage to the probe tip 15 or probe body 11.

In FIG. 2, the shortest distance 23 may be along a conical surface of the probe tip 15 assuming that the core of probe tip 15 extends into probe body 11 by a greater distance. It is to be understood however that the probe tip 15 may be provided in other geometries, shapes, or configurations, and/or in other mounting styles and which may alter the length of the shortest distance 23 between the contact surface 25 and the portion of probe body 11 nearest the contact surface 25. For example, a butted connection (not shown) between probe tip 15 and probe body 11 may define an axial path (i.e., along a direction parallel to an axis of the conductive probe) of the shortest distance 23. In an embodiment, shortest distance 23 may be less than approximately 0.250 inch in order to maintain a sufficiently low resistance for conductive probe 10. In another embodiment, shortest distance 23 may be less than approximately 0.100 inch. However, shortest distance may be larger than 0.250 inch. Additionally, gold plating (not shown) may be applied to the probe tip 15 to improve contact resistance of the surface of the probe tip 15 or to prevent corrosion of the probe tip 15.

Referring still to FIG. 2, in an embodiment, the thorium-tungsten of the probe tip 15 may have a concentration of between approximately 0.5% and approximately 5% (percent) thorium by weight, the remaining weight being tungsten. More typically, the concentration of thorium may be approximately 1-2% by weight. However, the thorium-tungsten of the probe tip 15 may be provided in any concentration of thorium by weight relative to the tungsten. Thorium, a radioactive material, may be added to tungsten in a process of doping using thorium oxide, or the thorium may be added to tungsten using other techniques known in metallurgy. Thorium-tungsten may also be referred to as thoriated-tungsten. Adding thorium to tungsten may increase the current-carrying capacity of the tungsten by approximately 20% to 50%, enhancing the ability of the probe tip to conduct high current flows in the presence of arcing without material damage. Thorium may also increase tungsten's emissivity in vacuum tubes.

Performance tests on a 2% thoriated-tungsten probe tip 15 that was press fit into a brass probe body 11 demonstrated that the thoriated-tungsten probe tip 15 may have substantial immunity to material break down during arcing and 100 amp current availability. After repeated cycles of live contact of the probe tip 15 to a brass conductor wherein arcing was observed, the thoriated-tungsten probe tip 15 exhibited no measurable increase in the resistance of the conductive probe 10, demonstrating that thorium-tungsten advantageously serves as a durable material for probe tip 15. Furthermore, the performance tests demonstrated that the functioning of arc detection circuitry (e.g., of circuit tester 31) is unimpaired by the use of the thoriated-tungsten probe tip 15. Advantageously, the use of a compact press fit geometry of the probe tip 15 into the probe body 11 minimized the electrical resistance of conductive probe 10 to an amount below the measurement resolution. The performance tests of the probe tip demonstrated that the objectives of measurement accuracy, high resolution, arc immunity, proper arc detection, and non-interference with the operating point of the circuit under test may be achieved with a balanced thorium-tungsten design.

During the measurement of high current flow, and during arcing, local heating of probe tip 15 may temporarily raise the test probe resistance for probe tip materials having a positive temperature coefficient. For example, the thermal coefficient of electrical conductivity of thorium-tungsten may be approximately 0.0045/° C. compared to approximately 0.0015/° C. for brass, meaning that the electrical resistance of thorium-tungsten may be much higher than the electrical resistance of brass when resistively heated. However, by using a probe tip 15 having a compact geometry (e.g., a relatively small size or volume), a low resistivity material for the probe body 11, and a shortest distance 23 between the probe tip 15 and the probe body 11, a balance in performance attributes may be achieved, including relatively high measurement resolution, improved durability of the probe tip in the presence of repeated arcing, relatively low cost, and relatively fast rise time performance for arc detection circuitry. Advantageously, in the performance tests mentioned above, neither arc heating nor resistive heating were measurably occurring.

Referring to FIG. 3, shown is an embodiment of a conductive probe 10 electrically and mechanically mated via probe plug 33 to circuit tester 31 by inserting probe plug 33 into circuit tester jack 34. In an embodiment, the probe plug 33 may be slidably inserted into the circuit tester jack 34 or the probe plug may be threadably engaged (not shown) to the circuit tester 31. The mating of the outer surface of probe plug 33 to the inner surface of circuit tester jack 34 may provide a low contact resistance which may minimize measurement error, yet allow for easy replacement of conductive probe 10. Probe body 11 may, by virtue of a relatively large diameter shaft, provide a low resistance path to probe tip 15 between contact surface 25 and probe body 11. Probe tip 15 extends from buried end width 20 to narrowed end 14 and may be conical in shape, or may have some other shape to facilitate contact of the probe tip to a circuit node (not shown). In an embodiment, the probe tip 15 may have a sharpened end terminating in a point or otherwise shaped to make reliable contact with a circuit node. The probe tip 15 may be configured to provide a shortest distance 23 between contact surface 25 and probe body 11 which may limit the resistance contribution from a probe tip 15 comprised preferably of thorium-tungsten, allowing good measurement resolution under all test conditions.

The conductive probe 10 may be comprised substantially of probe body 11 made from a material of relatively low electrical resistivity in order that a relatively compact volume of thorium-tungsten may be used for probe tip 15. In one embodiment, at least approximately 80% by volume of the conductive probe 10 may be comprised of the probe body 11. In another embodiment, approximately 97% of the conductive probe 10 may be comprised of the probe body 11, the remaining approximately 3% of the volume comprising the probe tip 15. It is to be understood that this disclosure is not limited to the above-mentioned proportions of probe body volume to probe tip volume. In this regard, the conductive probe 10 may be provided in any proportion of probe body volume to probe tip volume that provides a balance of a low conductive probe resistance with relatively high durability of the probe tip under arcing and high current flows.

Referring still to FIG. 3, portions of the probe body 11 may be enclosed in an insulating layer (not shown) for preventing unintended electrical shorting to the test environment. Furthermore, a portion of the probe body 11 may be enclosed with a handle (not shown) for handling the conductive probe 10 conveniently. The handle (not shown) and insulating layer (not shown) functions may be combined. Additionally, circuit tester 31 may be replaced with a jumper or test lead suitable for establishing a temporary connection between the circuit node in communication with contact surface 25 and another circuit node in the same or another electrical circuit. In this regard, the probe tip 15 and probe body 11 configuration disclosed herein may be installed on or integrated into a jumper or a test lead. As indicated above, the thoriated-tungsten composition of the probe tip 15 may advantageously minimize degradation or damage that may otherwise occur in a conventional probe tip such as due to arcing.

Referring now to FIG. 4, shown is a cutaway perspective view of an embodiment of probe body 11 including a probe tip 15 which may include a cylindrically-shaped buried end (not shown) and including a conical shape narrowing to a narrowed end 14. In an embodiment, the buried end (not shown) of probe tip 15 may have a buried end width 20 that may extend into an interior of the probe body 11. The buried end of the probe tip 15 may extend far enough into the probe body 11 such that the shortest distance 23 between the probe tip 15 terminal end and the probe body 11 is measured along the surface of the probe tip 15. As may be more evident in FIG. 4, thorium-tungsten probe tip 15 may have a generally compact geometry and a small volume relative to probe body 11, and which may advantageously give rise to a small path resistance through probe tip 15 and probe body 11.

Referring now to FIG. 5, shown is an exploded side sectional view of an embodiment of the conductive probe 10. Probe tip 15 may have a buried end 13 that may be sized to provide a press fit into the socket 16 along interference fit surface 12 within probe body 11. As indicated above, the probe body 11 may be configured to communicate with (e.g., is mounted to or integrated with) a circuit tester, a jumper or test lead, or other electrical device or electrical component. Buried end 13 may have a buried end length 19 that may be greater than or approximately equal to socket length 18 along interference surface 12. Buried end width 20 may be sized to form an interference fit of from approximately 0.0001 inch to approximately 0.005 inch with socket 16. For example, for a buried end 13 width of approximately 0.250 inch, the socket 16 may have a diameter of approximately 0.249 inch. The buried end 13 width and the socket 16 width (e.g., diameter) may be such that a negligible contact resistance occurs between probe tip 15 and probe body 11, and such that the probe tip 15 is retained within the probe body 11. Probe tip 15 may be sharpened or shaped to a narrowed end 14, terminating at contact surface 25 and being configured for piercing an insulated electrical wire (not shown) and/or for penetrating an exposed electrical terminal (not shown). However, the probe tip 15 may be provided in any one of a variety of alternative shapes and configurations configured complementary to a specific application. For example, the probe tip 15 may be provided with a generally blunt or flattened terminal end (not shown), a generally rounded end (not shown), a multi-pronged shape, or other shapes, and is not limited to the conical shape of the probe tip 15 shown in the figures.

Although FIG. 5 may suggest that the buried end 13 and socket 16 has a cylindrical shape, the buried end 13 and socket 16 may be provided in other geometries. For example, buried end 13 and socket 16 may be rectangular (not shown), square, or other faceted cross-sectional shapes, or buried end 13 and socket 16 may be axially splined (not shown), helically threaded, ribbed, or provided with other mechanical surface features for interlocking the probe tip 15 to the probe body 11. Alternatively, probe tip 15 may be provided with a socket (not shown) to mate with a plug (not shown) that may be formed on an end of the probe body 11. In one embodiment, buried end 13 may have a buried end width 20 of less than or no greater than approximately 0.250 inch for the purpose of minimizing the distance between contact surface 25 and the nearest portion of probe body 11. In another embodiment, buried end 13 may have a buried end width 20 of approximately 0.097 inch. In a further embodiment, buried end 13 may have a buried end width 20 of approximately 0.125 inch. In this regard, the buried end 13 of the probe tip 15 may be provided in any buried end width 20, without limitation. In an embodiment, the ratio of buried end width 20 to socket length 18 may preferably range from approximately 1:1 to approximately 3:1. In another embodiment, the ratio of buried end width 20 to socket length 18 may preferably be approximately 2:1. However, the probe tip 15 and probe body 11 may be configured to provide any ratio of buried end width 20 to socket length 18.

In an embodiment (not shown), the buried end length 19 may be greater than the socket length 18 which may result in the start of the narrowed end 14 protruding (not shown) past the end of the probe body 11 by more than the length of the conical portion of probe tip 15, leading to an increased distance between contact surface 25 and the free end of probe body 11 nearest the contact surface 25. Such protrusion of probe tip 15 beyond free end of probe body 11 may be desirable in extending a narrow tip deeper into a cramped region of circuitry to be tested. In the case where the start of the narrowed end 14 protrudes past the end of the probe body 11, the shortest distance (not shown) between the contact surface 25 and the nearest portion of the probe body 11 may be along an interior of the probe tip 15 and not along an outer surface of probe tip 15.

Referring to FIG. 6, shown is a side sectional view of an embodiment of the conductive probe 10 showing the buried end 13 of the probe tip 15 press fit into the probe body 11. The probe tip 15 is engaged to the probe body 11 along an interference fit surface 12 having an engagement length 22. The probe body 11 may be configured to communicate with a circuit tester or jumper as indicated above.

Referring to FIG. 7, shown is an end view of an embodiment of the probe tip 15 mated to the probe body 11. As indicated above, the probe tip 15 may be press fit into the probe body although other engagement configurations (e.g., threaded engagement or other mechanical interlocking) are possible. In an embodiment, the probe tip 15 may have a buried end width 20 that may be less than an outer diameter of the probe body 11. Probe tip 15 may be sharpened to a pointed contact surface 25 for contacting an electrical circuit to be tested. In a further embodiment, the contact surface 25 of the probe tip may be provided with multiple prong points, a blade having a narrowed linear edge, or other geometries which simultaneously provide for low electrical contact resistance with a circuit node (not shown) and low electrical path resistance within probe tip 15.

Referring to FIGS. 8A, 8B, and 8C, shown are embodiments of a conductive probe 10 in progressive stages of interacting with a circuit node 24 of an electrical path 27. Circuit node 24 may be an insulated wire or an exposed electrical terminal or any other electrical system, electrical device, electrical assembly or electrical component. As indicated above, the buried end 13 of the probe tip 15 may be press fit into the probe body 11 along engagement length 22. In the embodiments shown, the probe tip 15 may be shaped to have a narrowed end 14 terminating at the contact surface 25. Shortest distance 23 may provide the lowest resistance path from contact surface 25 to the nearest portion of probe body 11.

Referring to FIG. 8A, shown is an embodiment of the conductive probe 10 in a "ready" position hovering over circuit node 24 in an unpowered (i.e., non-energized) state. No current is flowing through conductive probe 10, and electrical path 27 may or may not be energized. Advantageously, the probe tip 15 may be comprised of thorium-tungsten to withstand any arcing that may occur in the "ready" position when the probe tip 15 is in relatively close proximity to the circuit node 24.

Referring to FIG. 8B, shown is an embodiment of the conductive probe 10 unpowered and in a "contact" stage. The contact surface 25 of the probe tip 15 is shown contacting the circuit node 24. No current is flowing through conductive probe 10, and the electrical path 27 may or may not be energized.

Referring to FIG. 8C, shown is an embodiment of the conductive probe 10 in an "energized" stage wherein contact surface 25 of the probe tip 15 is contacting circuit node 24. In an embodiment, the circuit tester 31 (FIG. 2) may be engaged to transmit electrical current to the circuit node 24, creating lines of uniform current density 26. In another embodiment, electrical path 27 may be energized and circuit tester 31 may receive electrical current from the electrical path 27 as part of the measurement being performed, and resulting in lines of uniform current density 26 in the probe tip 15. Lines of uniform current density 26 may be most closely packed along the shortest distance 23 path and more loosely packed along an axial direction of the probe tip because the axial path is a longer distance to the probe body 11 than the shortest distance 23, and because the axial direction may have greater electrical resistance, and hence is less preferred by flowing electrons.

Referring still to FIG. 8C, the size, shape, configuration, and/or geometry of the conductive probe 10 (e.g., the probe body 11 and/or probe tip 15) may be optimized by evaluating the lines of uniform current density 26 in the probe tip 15. In this regard, the geometry for the conductive probe 10 may be selected to minimize the distance (i.e., shortest distance 23) between the contact surface of the probe tip 15 and the portion of the probe body 11 nearest the contact surface 25, thereby minimizing the resistance of conductive probe 10. In addition, the conductive probe 10 may be configured in consideration of the amount of surface area at the interface between the probe tip 15 and the probe body 11. For example, a larger surface area of the interference fit surface 12 may generate a smaller electrical resistance for the conductive probe 10, and a smaller amount of surface area of the interference fit surface 12 may result in a larger electrical resistance for the conductive probe 10. In addition, the electrical current may be made to flow in either direction with both directions providing the same electrical path.

Additional modifications and improvements of the present disclosure may be apparent to those of ordinary skill in the art. Thus, the particular combination of parts described and illustrated herein is intended to represent only certain embodiments of the present disclosure and is not intended to serve as limitations of alternative embodiments or devices within the spirit and scope of the disclosure.

What is claimed is:

1. A conductive probe, comprising:
a probe body configured for communicating with a circuit tester or a jumper, the probe body comprising metal and having a free end;
the conductive probe having only one probe tip, the probe tip configured for contacting a circuit node, the probe tip mounting to the free end, the probe tip being comprised of thorium-tungsten; and
wherein the probe tip is configured to (1) transmit electrical current to a circuit node so as to energize an electrical path and (2) measure one or more electrical parameters.

2. The conductive probe of claim 1, further comprising:
a probe plug; and
the probe body being removably engageable to the circuit tester or the jumper via the probe plug.

3. The conductive probe of claim 1 wherein:
the probe tip is approximately 0.5-5.0 percent thorium by weight.

4. The conductive probe of claim 1 wherein:
the probe tip is conical in shape.

5. The conductive probe of claim 1 wherein:
the probe tip is narrowed to a contact surface for contacting the circuit node.

6. The conductive probe of claim 5 wherein:
the probe tip is configured such that a shortest distance between the contact surface and the probe body is less than approximately 0.250 inch.

7. The conductive probe of claim 5 wherein:
the probe tip is configured such that a shortest distance between the contact surface and the probe body is approximately 0.100 inch.

8. The conductive probe of claim 1 wherein:
the probe body is comprised of brass.

9. The conductive probe of claim 8 wherein:
the probe body is at least approximately 80 percent of the conductive probe by volume.

10. The conductive probe of claim 1, further comprising:
a gold plating applied to the probe tip.

11. A conductive probe, comprising:
a probe body configured for communicating with a circuit tester or a jumper, the probe body comprising metal and having a free end;
a socket being formed in the free end;
a singular probe tip, the probe tip having a buried end and a narrowed end located opposite the buried end, the buried end being mountable within the socket, the socket being shaped and sized complementary to the buried end in order to minimize contact resistance therebetween, the narrowed end being narrowed to a contact surface for contacting a circuit node;
the probe tip being comprised of thorium-tungsten and being configured such that a shortest distance between the contact surface and the probe body is less than approximately 0.250 inch; and
wherein the probe tip is configured to (1) transmit electrical current to a circuit node so as to energize an electrical path and (2) measure one or more electrical parameters.

12. A conductive probe narrowing into a singular probe tip, comprising:
a probe tip receivable by a probe body configured for communicating with a circuit tester or a jumper, the probe tip having a buried end and a narrowed end located opposite the buried end;
the buried end being receivable by the probe body in such a manner that contact resistance between the probe tip and the probe body is minimized;
the narrowed end being narrowed to a contact surface for contacting a circuit node;
the probe tip being comprised of thorium-tungsten and being configured such that a shortest distance between the contact surface and the probe body is less than approximately 0.250 inch; and
wherein the probe tip is configured to (1) transmit electrical current to a circuit node so as to energize an electrical path and (2) measure one or more electrical parameters.

13. The tip of claim 12 wherein:
the probe tip is approximately 0.5-5.0 percent thorium by weight.

14. The tip of claim 12 wherein:
the probe tip has a conical shape.

15. The tip of claim 12 wherein:
the shortest distance between the contact surface and the probe body is approximately 0.100 inch.

16. The tip of claim 12 wherein:
the buried end is sized to provide an interference fit with a socket formed in the probe body.

17. The tip of claim 16 wherein:
the buried end has a width of no greater than approximately 0.250 inch.

18. The tip of claim 16 wherein the buried end has a width of one of the following:
approximately 0.097 inch; and approximately 0.125 inch.

19. The tip of claim 12 wherein:
the buried end of the probe tip has a cylindrical shape.

20. The tip of claim 12, further comprising:
a gold plating applied to the probe tip.

* * * * *